(12) United States Patent
Chen et al.

(10) Patent No.: US 11,750,198 B2
(45) Date of Patent: Sep. 5, 2023

(54) RC OSCILLATOR

(71) Applicant: HUAWEI TECHNOLOGIES CO., LTD., Shenzhen (CN)

(72) Inventors: Yanqin Chen, Shanghai (CN); Chunbiao Wu, Shanghai (CN); Yongwang Liu, Shanghai (CN); Bingzhao Zhang, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/564,595

(22) Filed: Dec. 29, 2021

(65) Prior Publication Data

US 2022/0123691 A1    Apr. 21, 2022

Related U.S. Application Data

(63) Continuation of application No. PCT/CN2019/093941, filed on Jun. 29, 2019.

(51) Int. Cl.
*H03L 7/02*    (2006.01)

(52) U.S. Cl.
CPC .................................... *H03L 7/02* (2013.01)

(58) Field of Classification Search
CPC ............................ H03L 7/02; H02K 3/0322
See application file for complete search history.

(56) References Cited

U.S. PATENT DOCUMENTS

| 5,594,388 | A | * | 1/1997 | O'Shaughnessy | ....... | H03K 3/03 |
| | | | | | | 331/8 |
| 9,444,468 | B2 | * | 9/2016 | Astrom | ................ | H03K 3/0231 |
| 2006/0063502 | A1 | * | 3/2006 | Shibuya | .................... | H03L 7/02 |
| | | | | | | 455/76 |
| 2008/0068091 | A1 | * | 3/2008 | Kwan | ....................... | H03L 7/02 |
| | | | | | | 331/16 |
| 2010/0301951 | A1 | * | 12/2010 | Xue | ..................... | H03K 3/0322 |
| | | | | | | 331/57 |
| 2011/0248786 | A1 | * | 10/2011 | Sako | ........................ | H03L 7/00 |
| | | | | | | 331/34 |
| 2013/0181760 | A1 | | 7/2013 | Lin | | |
| 2016/0094271 | A1 | | 3/2016 | Kawano | | |

FOREIGN PATENT DOCUMENTS

| CN | 103546121 A | 1/2014 |
| CN | 104852769 A | 8/2015 |
| CN | 107112947 A | 8/2017 |
| CN | 108288962 A | 7/2018 |
| WO | 2002025815 A1 | 3/2002 |
| WO | 2015191000 A1 | 12/2015 |

\* cited by examiner

*Primary Examiner* — Ryan Johnson
(74) *Attorney, Agent, or Firm* — Rimon PC

(57) ABSTRACT

Embodiments of this application disclose an RC oscillator that amplifies a difference between a first voltage and a second voltage by using a first amplifier and a second amplifier. The first amplifier may include a first amplification circuit and a second amplification circuit. The first amplification circuit and the second amplification circuit may share a same voltage-current conversion circuit. The RC oscillator disclosed in the embodiments of this application not only avoids noise introduced by the first amplifier, but also reduces internal noise of the RC oscillator and a jitter of a clock signal.

10 Claims, 5 Drawing Sheets

RC OSCILLATOR

CROSS-REFERENCE TO RELATED APPLICATIONS

This application is a continuation of International Application No. PCT/CN2019/093941, filed on Jun. 29, 2019, which is hereby incorporated by reference in its entirety.

TECHNICAL FIELD

Embodiments of this application relate generally to the field of integrated circuits, and in particular, to an RC oscillator.

BACKGROUND

In many portable electronic devices, a low noise oscillator is usually required. For example, the oscillator may be used as a system clock. Oscillators may be classified as a resistor capacitance (RC) oscillator, an inductance capacitance (LC) oscillator, a quartz crystal oscillator, and the like.

The RC oscillator is an oscillator that outputs an oscillation signal by charging and discharging a capacitor. A frequency of the oscillation signal can be adjusted by adjusting a value of resistance or capacitance. Compared with other types of oscillators, the RC oscillator is widely used in the market due to a simple structure, defining a smaller area, low costs, and few peripheral components.

However, in conventional technologies, RC oscillators may be subject to process deviation and noise interference within their internal modules, which may result in large frequency jitters and large deviations for the output clock signal.

SUMMARY

Embodiments of this application provide for a RC oscillator that reduces internal noise of the RC oscillator and reduces a jitter of a clock signal.

According to a first aspect, an embodiment of this application provides for an integrated circuit. The integrated circuit includes a first amplifier and a second amplifier. The first amplifier includes a first input terminal, a second input terminal, a first amplification circuit, a second amplification circuit, a first output terminal, and a second output terminal. The first input terminal is configured to input a first voltage $V_{REF}$, and the second input terminal is configured to input a second voltage $V_{PERIOD}$. The first output terminal is configured to output a third voltage $V_P$, where the third voltage $V_P$ is a voltage obtained after the first voltage $V_{REF}$ passes through the first amplification circuit. The second output terminal is configured to output a fourth voltage $V_N$, where the fourth voltage $V_N$ is a voltage obtained after the second voltage $V_{PERIOD}$ passes through the second amplification circuit. The first amplification circuit and the second amplification circuit share a voltage-current conversion circuit. The second amplifier includes a third input terminal, a fourth input terminal, and a third output terminal. The third input terminal is configured to input the third voltage $V_P$. The fourth input terminal is configured to input the fourth voltage $V_N$. The third output terminal is configured to output a fifth voltage $V_{OUT}$.

The voltage-current conversion circuit is configured to convert the first voltage $V_{REF}$ input by the first input terminal or the second voltage $V_{PERIOD}$ input by the second input terminal into a current.

The second amplifier is a differential amplifier. The third input terminal is a positive input terminal of the differential amplifier, and the fourth input terminal is a negative input terminal of the differential amplifier.

In embodiments of this application, the first amplification circuit and the second amplification circuit share the same voltage-current conversion circuit, respectively amplify the first voltage and the second voltage, and then input an amplified first voltage and an amplified second voltage to the differential amplifier. This can not only amplify a difference between the first voltage and the second voltage, but also cancel out noise caused by the voltage-current conversion circuit. If the integrated circuit is applied to an RC oscillator, amplifying the difference between the first voltage and the second voltage enables low-amplitude frequency changes of medium and low frequencies inside the RC oscillator to be tracked in time. This reduces an output jitter caused by the frequency changes of the medium and low frequencies.

In a possible implementation, the integrated circuit may further include a low-pass filter and a voltage-controlled oscillator. A control voltage $V_{CTRL}$ is obtained after the fifth voltage $V_{OUT}$ passes through the low-pass filter. A clock signal is obtained after the control voltage $V_{CTRL}$ passes through the voltage-controlled oscillator.

A frequency of the clock signal is directly proportional to a value of the control voltage $V_{CTRL}$.

According to the integrated circuit provided in some embodiments of this application, high-frequency noise in the voltage output by the second amplifier may be filtered out by the low-pass filter, and the clock signal may be continuously modulated by the voltage-controlled oscillator. This improves adjustment precision of the integrated circuit and reduces a random jitter of the clock signal.

In another possible implementation, the integrated circuit further includes a pulse generator. The pulse generator is configured to generate, based on the clock signal, a control signal used to control the first amplifier.

The control signal includes a first clock signal, a second clock signal, and a reset signal. The voltage-current conversion circuit includes a first switch (S15), a second switch (S16), a first capacitor (C14), and a MOS transistor (N11). Both the first switch (S15) and the second switch (S16) are switches turned on by using a high level signal, and both the first switch (S15) and the second switch (S16) are controlled by the reset signal. The first capacitor is connected in parallel to the second switch (S16), a first terminal of the first capacitor (C14) is connected to a source of the MOS transistor (N11), and a second terminal of the first capacitor (C14) is grounded. A gate of the MOS transistor (N11) is grounded through the first switch (S15).

The control signal further includes a first sampling signal. The first amplification circuit includes a third switch (S14), the voltage-current conversion circuit, a fourth switch (S17), a fifth switch (S19), a sixth switch (S21), a second capacitor (C18), and a third capacitor (C16). The third switch (S14), the fourth switch (S17), the fifth switch (S19), and the sixth switch (S21) are turned on by using a high level signal, both the third switch (S14) and the fourth switch (S17) are controlled by the first clock signal, the fifth switch (S19) is controlled by the first sampling signal, and the sixth switch (S21) is controlled by the reset signal. The first input terminal is connected to the gate of the MOS transistor (N11) through the third switch (S14). A drain of the MOS transistor (N11) is connected to a first terminal of the second capacitor (C18) through the fourth switch (S17), and a second terminal of the second capacitor (C18) is grounded. The third capacitor (C16) is connected in parallel to the sixth switch (S21), a first terminal of the third capacitor (C16) is connected to a power supply, and a second terminal of the third capacitor (C16) is connected to the first terminal of the second capacitor (C18). The fifth switch (S19) is connected to the first terminal of the second capacitor (C18). When the fifth switch (S19) is closed, a voltage at the first terminal of the second capacitor (C18) is the third voltage $V_P$.

The control signal further includes a second sampling signal. The second amplification circuit includes a seventh switch (S13), the voltage-current conversion circuit, an eighth switch (S18), a ninth switch (S20), a tenth switch (S22), a fourth capacitor (C15), and a fifth capacitor (C17). The seventh switch (S13), the eighth switch (S18), the ninth switch (S20), and the tenth switch (S22) are turned on by using a high level signal, both the seventh switch (S13) and the eighth switch (S18) are controlled by the second clock signal, the ninth switch (S20) is controlled by the second sampling signal, and the tenth switch (S22) is controlled by the reset signal. The second input terminal is connected to the gate of the MOS transistor (N11) through the seventh switch (S13). The drain of the MOS transistor (N11) is connected to a first terminal of the fourth capacitor (C15) through the eighth switch (S18), and a second terminal of the fourth capacitor (C15) is grounded. The fifth capacitor (C17) is connected in parallel to the tenth switch (S22), a first terminal of the fifth capacitor (C17) is connected to the power supply, and a second terminal of the fifth capacitor (C17) is connected to the first terminal of the fourth capacitor (C15). The ninth switch (S20) is connected to the first terminal of the fourth capacitor (C15). When the ninth switch (S20) is closed, a voltage at the first terminal of the fourth capacitor (C15) is the fourth voltage $V_N$.

Embodiments of this application provide examples of detailed circuit structures of the first amplification circuit and the second amplification circuit, and a detailed circuit structure of the voltage-current conversion circuit shared by the first amplification circuit and the second amplification circuit. By using the same voltage-current conversion circuit, a noise current caused by the voltage-current conversion circuit can be canceled out at two differential input terminals of the second amplifier, and the difference between the first voltage and the second voltage can also be amplified. This reduces internal noise of the RC oscillator and reduces a jitter of an output clock signal.

In another possible implementation, the integrated circuit further includes a second voltage generator. The pulse generator is further configured to generate, based on the clock signal, a charging signal and a discharging signal that are used to control the second voltage generator. The second voltage generator includes a first resistor (R13), a sixth capacitor (C13), an eleventh switch (S11), and a twelfth switch (S12). Both the eleventh switch (S11) and the twelfth switch (S12) are switches turned on by using a high level signal, the eleventh switch (S11) is controlled by the charging signal, and the twelfth switch (S12) is controlled by the discharging signal. A first terminal of the first resistor (R13) is connected to the power supply through the eleventh switch (S11), a second terminal of the first resistor (R13) is connected to a first terminal of the sixth capacitor (C13), and the sixth capacitor (C13) is connected in parallel to the twelfth switch (S12). The second voltage $V_{PERIOD}$ is a voltage at the first terminal of the sixth capacitor (C13).

In the integrated circuit provided in some embodiments of this application, the second voltage generator generates a second voltage related to a frequency of a current charging signal by charging and discharging a resistor and a capacitor, so that a ripple of the second voltage can be reduced. This further reduces a jitter of the control signal $V_{CTRL}$ caused by the ripple, so as to reduce a jitter of the clock signal.

In another possible implementation, the second voltage generator further includes a seventh capacitor (C12) and a thirteenth switch (S10). The thirteenth switch (S10) is a switch turned on by using a high level signal, and the thirteenth switch (S10) is controlled by the second clock signal. A first terminal of the seventh capacitor (C12) is connected to a second terminal of the sixth capacitor (C13), and a second terminal of the seventh capacitor (C12) is connected to the first terminal of the first resistor (R13) through the thirteenth switch (S10).

In some embodiments of this application, the second voltage generator is connected to the seventh capacitor, so that a node at the first terminal of the first resistor becomes a low-speed node after the eleventh switch is opened, and remaining electric charge flows to the seventh capacitor, to ensure stability of the second voltage $V_{PERIOD}$ and reduce a jitter of the clock signal.

In another possible implementation, a high-level pulse width of the discharging signal is less than a low-level pulse width of the charging signal.

In another possible implementation, after the charging signal changes from a high level (e.g., high level signal) to a low level (e.g., low level signal), the discharging signal changes from a low level to a high level after preset duration.

In another possible implementation, the charging signal and the discharging signal are divide-by-2 signals of the clock signal, that is, periods of the charging signal and the discharging signal are twice a period of the clock signal.

In another possible implementation, periods of the first clock signal and the second clock signal are twice the period of the clock signal.

In another possible implementation, periods of the first sampling signal and the second sampling signal are twice the period of the clock signal.

For example, periods of the clock signal and the reset signal are 20.83 ns, and periods of the charging signal, the discharging signal, the first clock signal, the second clock signal, the first sampling signal, and the second sampling signal are 41.6 ns. Preset duration in which both the charging signal and the discharging signal are at a low level is 10 ns, duration in which the first clock signal is at a high level and duration in which the second clock signal is at a high level are 5.2 ns, duration in which the first sampling signal is at a high level and duration in which the second sampling signal is at a high level are 2 ns, and duration in which the reset signal is at a high level is 12.8 ns. The preset duration in which both the charging signal and the discharging signal are at a low level, the duration in which the first sampling signal is at a high level, the duration in which the second sampling signal is at a high level, the duration in which the first clock signal is at a high level, and the duration in which the second clock signal is at a high level may fluctuate with a process without affecting accuracy of a system output.

In another possible implementation, a high-level pulse width of the first clock signal is equal to a high-level pulse width of the second clock signal, and both the high-level pulse width of the first clock signal and the high-level pulse width of the second clock signal are less than a high-level pulse width of the charging signal.

In another possible implementation, when the charging signal changes from a low level to a high level triggers the first clock signal to change from a low level to a high level, and when the charging signal changes from a high level to a low level triggers the second clock signal to change from a low level to a high level.

In another possible implementation, when the first clock signal changes from a high level to a low level triggers the first sampling signal to change from a low level to a high level, and when the second clock signal changes from a high level to a low level triggers the second sampling signal to change from a low level to a high level. Both a high-level pulse width of the first sampling signal and a high-level pulse width of the second sampling signal are less than the high-level pulse width of the first clock signal.

For example, the high-level pulse width of the first sampling signal and the high-level pulse width of the second sampling signal are one tenth of the period of the clock signal.

In another possible implementation, when both the first clock signal and the second clock signal are at a low level, the reset signal is at a high level.

In some embodiments, a frequency of the reset signal is equal to the frequency of the clock signal.

In another possible implementation, duration in which both the charging signal and the discharging signal are at a low level is greater than or equal to a sum of the duration in which the second clock signal is at a high level and the duration in which the second sampling signal is at a high level.

In another possible implementation, the MOS transistor N11 is an N-type MOS transistor.

In another possible implementation, the MOS transistor N11 is a P-type MOS transistor.

According to a second aspect, an embodiment of this application provides an RC oscillator. The RC oscillator includes the integrated circuit provided in the first aspect or any one of the implementations of the first aspect.

It may be understood that, for beneficial effects that can be achieved by the RC oscillator provided in the second aspect, refer to beneficial effects in the first aspect. Details are not described herein again.

DESCRIPTION OF EMBODIMENTS

The technical solutions in the embodiments of this application are clearly described in detail in the following with reference to the accompanying drawings.

Figure 1:
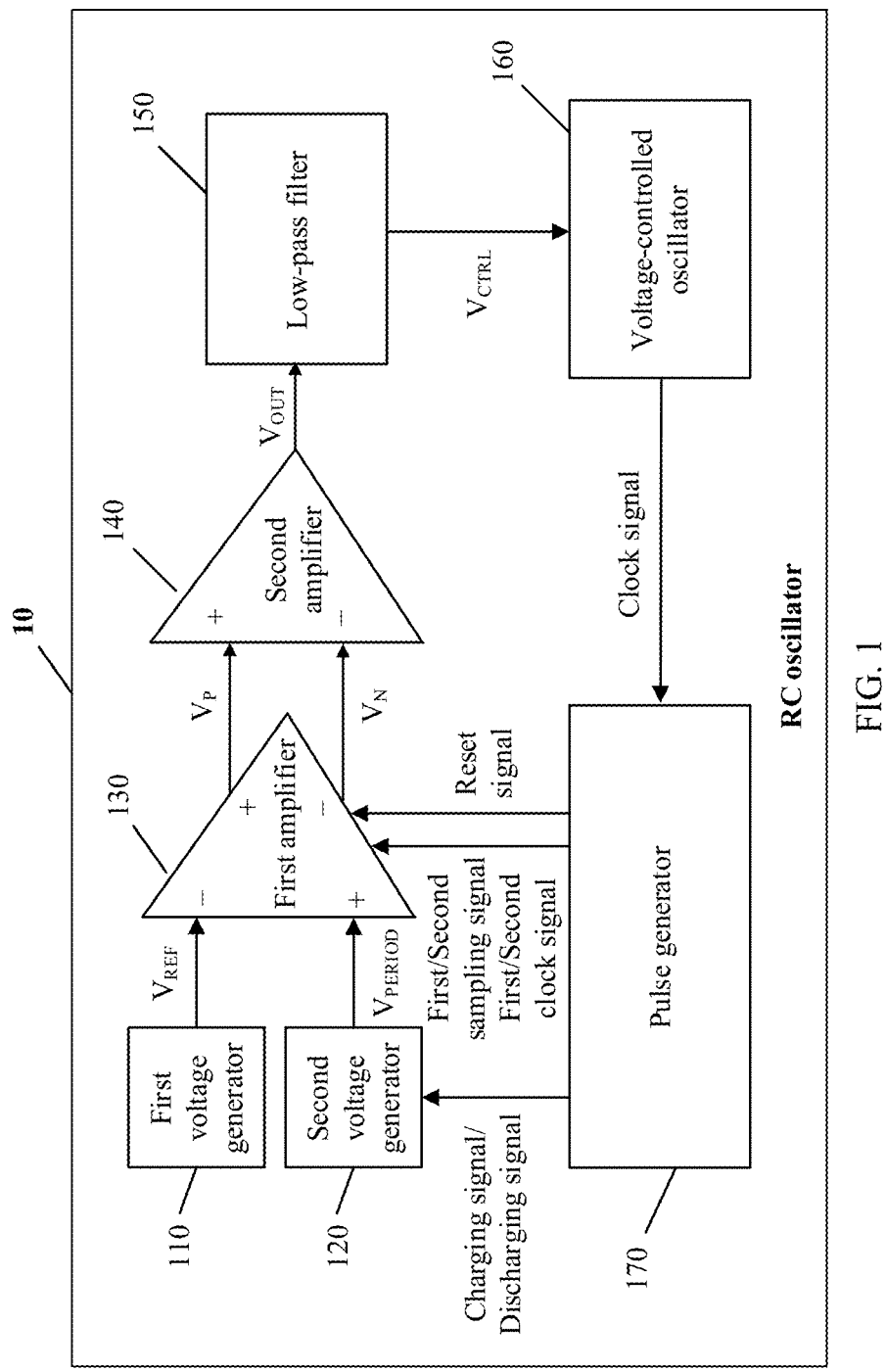
FIG. 1 is a diagram of a structure of an example RC oscillator according to an embodiment of this application.

First, refer to FIG. 1. FIG. 1 shows an example RC oscillator according to an embodiment of this application.

As shown in FIG. 1, an RC oscillator 10 may include a first voltage generator 110, a second voltage generator 120, a first amplifier 130, a second amplifier 140, a low-pass filter 150, a voltage-controlled oscillator 160, and a pulse generator 170.

The first voltage generator 110 may be configured to generate a first voltage $V_{REF}$.

The second voltage generator 120 may be configured to generate a second voltage $V_{PERIOD}$. The second voltage generator 120 may include, but is not limited to, a resistor and a capacitor. The second voltage may be a voltage that is related to a charging/discharging frequency and that is generated by charging/discharging the resistor and the capacitor.

The first amplifier 130 and the second amplifier 140 may be configured to amplify a difference between the first voltage and the second voltage, to output a fifth voltage $V_{OUT}$.

The low-pass filter 150 may be configured to filter out high-frequency noise in the fifth voltage $V_{OUT}$, to obtain a control voltage $V_{CTRL}$.

The voltage-controlled oscillator 160 may be configured to output a clock signal CLK based on the control voltage $V_{CTRL}$. A frequency of the clock signal CLK is directly proportional to a value of the control voltage $V_{CTRL}$.

The pulse generator 170 may be configured to output, based on the clock signal CLK, a signal used to control the second voltage generator 120 and a signal used to control the first amplifier 130.

The signal used to control the second voltage generator 120 may include a charging signal and a discharging signal. Further, the signal used to control the second voltage generator 120 may include a second clock signal.

The signal used to control the first amplifier 130 may include a first clock signal, the second clock signal, a first sampling signal, a second sampling signal, and a reset signal.

When the frequency of the clock signal output by the RC oscillator 10 is increased and charging time of the charging signal is reduced, the second voltage $V_{PERIOD}$ is reduced. After the second voltage $V_{PERIOD}$ passes through the first amplifier 130, a fourth voltage $V_N$ is increased. If a third voltage $V_P$ is a fixed value, a difference between the third voltage $V_P$ and the fourth voltage $V_N$ is reduced. After the difference is amplified by the second amplifier 140, the fifth voltage $V_{OUT}$ is reduced. After the fifth voltage $V_{OUT}$ passes through the low-pass filter 150, the control voltage $V_{CTRL}$ is reduced. Because the frequency of the clock signal CLK is directly proportional to the value of the control voltage $V_{CTRL}$, when the control voltage $V_{CTRL}$ is reduced, the frequency of the clock signal output by the voltage-controlled oscillator 160 is reduced, and a negative feedback is formed. This stabilizes the frequency.

When the frequency of the clock signal output by the RC oscillator 10 is reduced and the charging time of the charging signal is increased, the second voltage $V_{PERIOD}$ is increased. After the second voltage $V_{PERIOD}$ passes through the first amplifier 130, the fourth voltage $V_N$ is reduced. If the third voltage $V_P$ is a fixed value, a difference between the third voltage $V_P$ and the fourth voltage $V_N$ is increased. After the difference is amplified by the second amplifier 140, the fifth voltage $V_{OUT}$ is increased. After the fifth voltage $V_{OUT}$ passes through the low-pass filter 150, the control voltage $V_{CTRL}$ is increased. Because the frequency of the clock signal CLK is directly proportional to the value of the control voltage $V_{CTRL}$, when the control voltage $V_{CTRL}$ is increased, the frequency of the clock signal output by the voltage-controlled oscillator 160 is increased, and a negative feedback is formed. This stabilizes the frequency.

The following describes a relationship between the clock signal, the charging signal, the discharging signal, the first clock signal, the second clock signal, the first sampling signal, the second sampling signal, and the reset signal.

Figure 2:
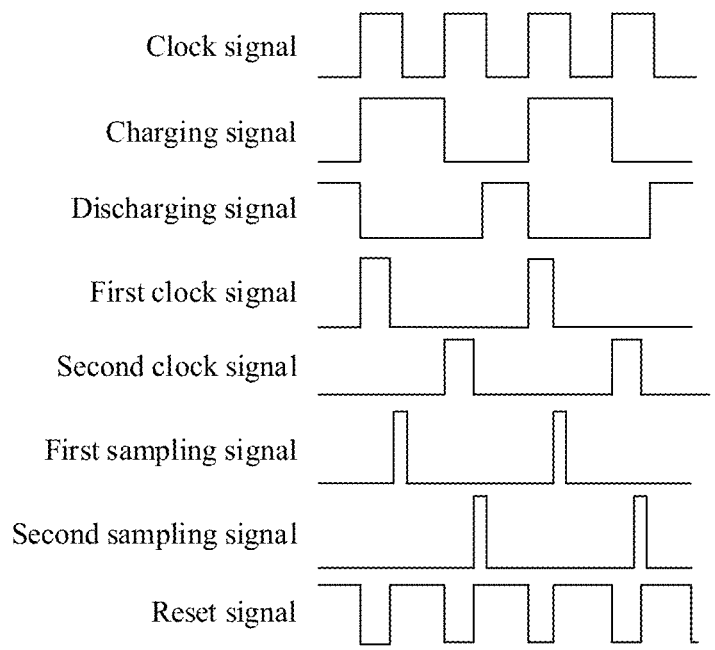
FIG. 2 is a diagram of a time sequence relationship between various signals according to an embodiment of this application.

FIG. 2 shows a time sequence relationship of several signals generated by the pulse generator.

As shown in FIG. 2, the charging signal is a divide-by-2 signal of the clock signal. After the charging signal changes from a high level to a low level, the discharging signal changes from a low level to a high level after preset duration. A low-level pulse width of the charging signal is greater than a high-level pulse width of the discharging signal. Therefore, both the charging signal and the discharging signal are at a low level within the preset duration. The preset duration may be, for example, a quarter of a period of the charging signal or the discharging signal. A ratio of the preset duration to the period of the charging signal or the discharging signal may fluctuate with a process. When the process fluctuates within a specific range, the preset duration can be adaptively adjusted without affecting accuracy of a system output.

It is assumed that a period of the clock signal is 20.83 ns, and periods of the charging signal and the discharging signal may be 41.6 ns (twice the period of the clock signal). The preset duration in which both the charging signal and the discharging signal are at a low level may be 10 ns.

When the charging signal changes from a low level to a high level may trigger the first clock signal to change from a low level to a high level. When the charging signal changes from a high level to a low level may trigger the second clock signal to change from a low level to a high level. A sum of duration in which the second clock signal is at a high level and duration in which the second sampling signal is at a high level is less than or equal to duration in which both the charging signal and the discharging signal are at a low level, that is, the preset duration. A high-level pulse width of the first clock signal may be equal to a high-level pulse width of the second clock signal, and both the high-level pulse width of the first clock signal and the high-level pulse width of the second clock signal are less than a high-level pulse width of the charging signal. For example, the high-level pulse width of the first clock signal or the high-level pulse width of the second clock signal may be one eighth of the period of the charging signal.

When the first clock signal changes from a high level to a low level may trigger the first sampling signal to change from a low level to a high level. When the second clock signal changes from a high level to a low level may trigger the second sampling signal to change from a low level to a high level. The sum of the duration in which the second clock signal is at a high level and the duration in which the second sampling signal is at a high level is less than or equal to the duration in which both the charging signal and the discharging signal are at a low level, that is, the preset duration. A high-level pulse width of the first sampling signal may be equal to a high-level pulse width of the second sampling signal. Both the high-level pulse width of the first sampling signal and the high-level pulse width of the second sampling signal may be less than the high-level pulse width of the first clock signal. Further, the high-level pulse width of the first sampling signal and the high-level pulse width of the second sampling signal may be one tenth of the period of the clock signal.

When both the first clock signal and the second clock signal are at a low level, the reset signal is at a high level. A frequency of the reset signal may be equal to the frequency of the clock signal.

Based on the time sequence relationship between the foregoing signals, the following describes a circuit structure of each component included in the RC oscillator 10.

Figure 3:
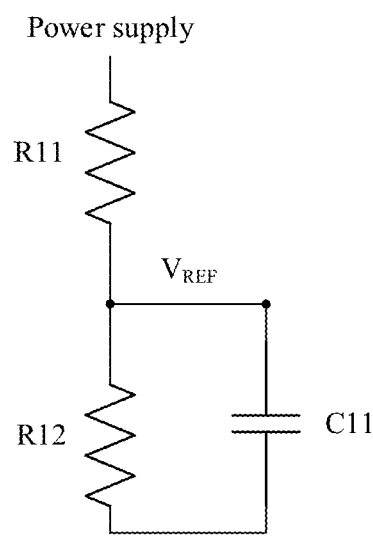
FIG. 3 is a circuit diagram of an example first voltage generator according to an embodiment of this application.

In referring to FIG. 3. FIG. 3 shows a circuit structure of an example first voltage generator.

As shown in FIG. 3, the first voltage generator 110 may include a resistor R11, a resistor R12, and a capacitor C11. A first terminal of the resistor R11 is connected to a power supply, a second terminal of the resistor R11 is connected to a first terminal of the resistor R12, and the resistor R12 is connected in parallel to the capacitor C11. A voltage at the second terminal of the resistor R11 is the first voltage $V_{REF}$.

The first voltage $V_{REF}$ is generated by dividing a voltage of the power supply by the resistor R11 and the resistor R12. The capacitor C11 is a filter capacitor, and may be configured to filter out high-frequency noise of the power supply.

Figure 4:
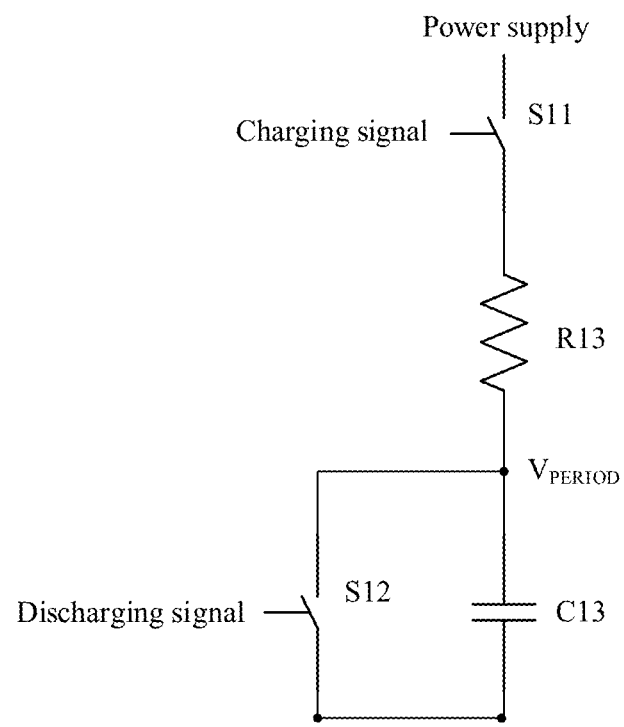
FIG. 4 is a circuit diagram of an example second voltage generator according to an embodiment of this application.

FIG. 4 shows a circuit structure of an example second voltage generator.

As shown in FIG. 4, the second voltage generator 120 may include a first resistor R13, a sixth capacitor C13, an eleventh switch S11, and a twelfth switch S12.

Both the eleventh switch S11 and the twelfth switch S12 are switches turned on by using a high level signal. The eleventh switch S11 is controlled by the charging signal, and the twelfth switch S12 is controlled by the discharging signal.

The eleventh switch S11 is closed when the charging signal is at a high level, and the eleventh switch S11 is opened when the charging signal is at a low level. The twelfth switch S12 is closed when the discharging signal is at a high level, and the twelfth switch S12 is opened when the discharging signal is at a low level.

Possibly, the eleventh switch S11 and the twelfth switch S12 may be NPN transistors. When a base of the NPN transistor is at a high level, the NPN transistor is turned on.

Possibly, the eleventh switch S11 and the twelfth switch S12 may be NMOS transistors. When a gate of the NMOS transistor is at a high level, the NMOS transistor is turned on.

A first terminal of the first resistor R13 is connected to the power supply through the eleventh switch S11, a second terminal of the first resistor R13 is connected to a first terminal of the sixth capacitor C13, and the sixth capacitor C13 is connected in parallel to the twelfth switch S12. The second voltage $V_{PERIOD}$ is a voltage at the first terminal of the sixth capacitor C13.

When the charging signal is at a high level, the discharging signal is at a low level. In this case, the eleventh switch S11 is closed, and the twelfth switch S12 is opened. The power supply may charge the sixth capacitor C13 by using the first resistor R13, where charging time is one clock period (the charging signal is a divide-by-2 signal of the clock signal). When one clock period ends, the charging signal is at a low level, and the eleventh switch is opened. The voltage at the first terminal of the sixth capacitor C13 remains unchanged and waits to be sampled by a post-stage circuit (that is, the first amplifier 130). The voltage at the first terminal of the sixth capacitor C13 is the second voltage $V_{PERIOD}$. A formula for calculating $V_{PERIOD}$ is as follows:

$$V_{PERIOD} = V_{power\ supply} \times \left[1 - \frac{1}{e^{period/(R13 \times C13)}}\right] \quad (1)$$

$V_{power\ supply}$ represents a voltage value of the power supply, period represents duration in which the charging signal is at a high level (the duration is equal to the period of the clock signal), R13 represents a resistance value of the first resistor, and C13 represents a capacitance value of the sixth capacitor.

In a sampling process, both the charging signal and the discharging signal are at a low level. Duration in which both the charging signal and the discharging signal are at a low level may be referred to as preset duration.

After the post-stage circuit completes sampling, the discharging signal changes from a low level to a high level, the twelfth switch S12 is closed, the sixth capacitor C13 starts to discharge, and the voltage on the sixth capacitor C13 may change to 0. When a next charging period arrives, the discharging signal may change from a high level to a low level, and the charging signal may change from a low level to a high level.

Figure 5:
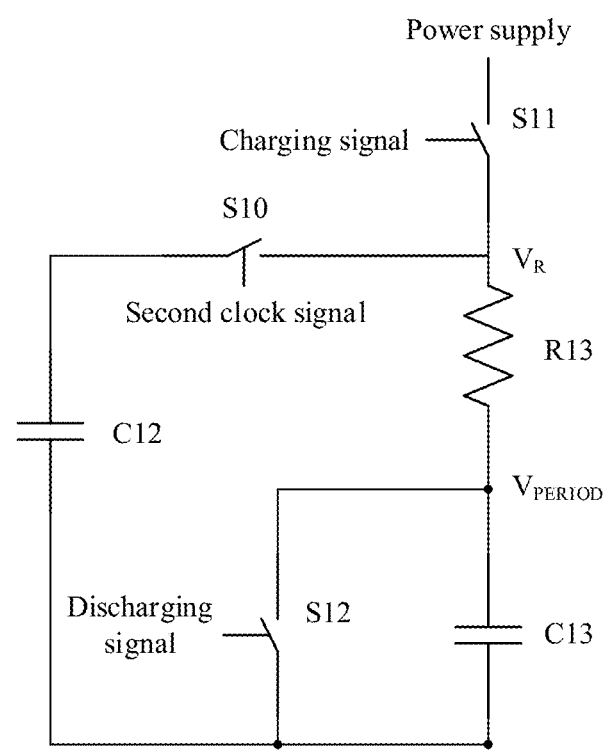
FIG. 5 is a circuit diagram of another example second voltage generator according to an embodiment of this application.

Further, FIG. 5 shows a circuit structure of another example second voltage generator.

As shown in FIG. 5, in addition to the first resistor R13, the sixth capacitor C13, the eleventh switch S11, and the twelfth switch S12, the second voltage generator 120 may further include a seventh capacitor C12 and a thirteenth switch S10.

The thirteenth switch S10 is similar to the eleventh switch S11 and the twelfth switch S12, and may be a switch turned on by using a high level signal. The thirteenth switch S10 is controlled by the second clock signal.

The thirteenth switch S10 is closed when the second clock signal is at a high level, and the thirteenth switch S10 is opened when the second clock signal is at a low level.

It can be learned from the time sequence relationship between the signals shown in FIG. 2 that, when the second clock signal is at a high level, both the charging signal and the discharging signal are at a low level. If the second clock signal is at a high level, the thirteenth switch S10 is closed, S11 is opened, the seventh capacitor C12 is connected to a circuit, and remaining charge at a VR point may flow to the seventh capacitor C12, so that the VR point changes to a low-speed node, to ensure that the second voltage $V_{PERIOD}$ sampled by the post-stage circuit remains stable, and reduce a jitter of the clock signal.

Figure 6:
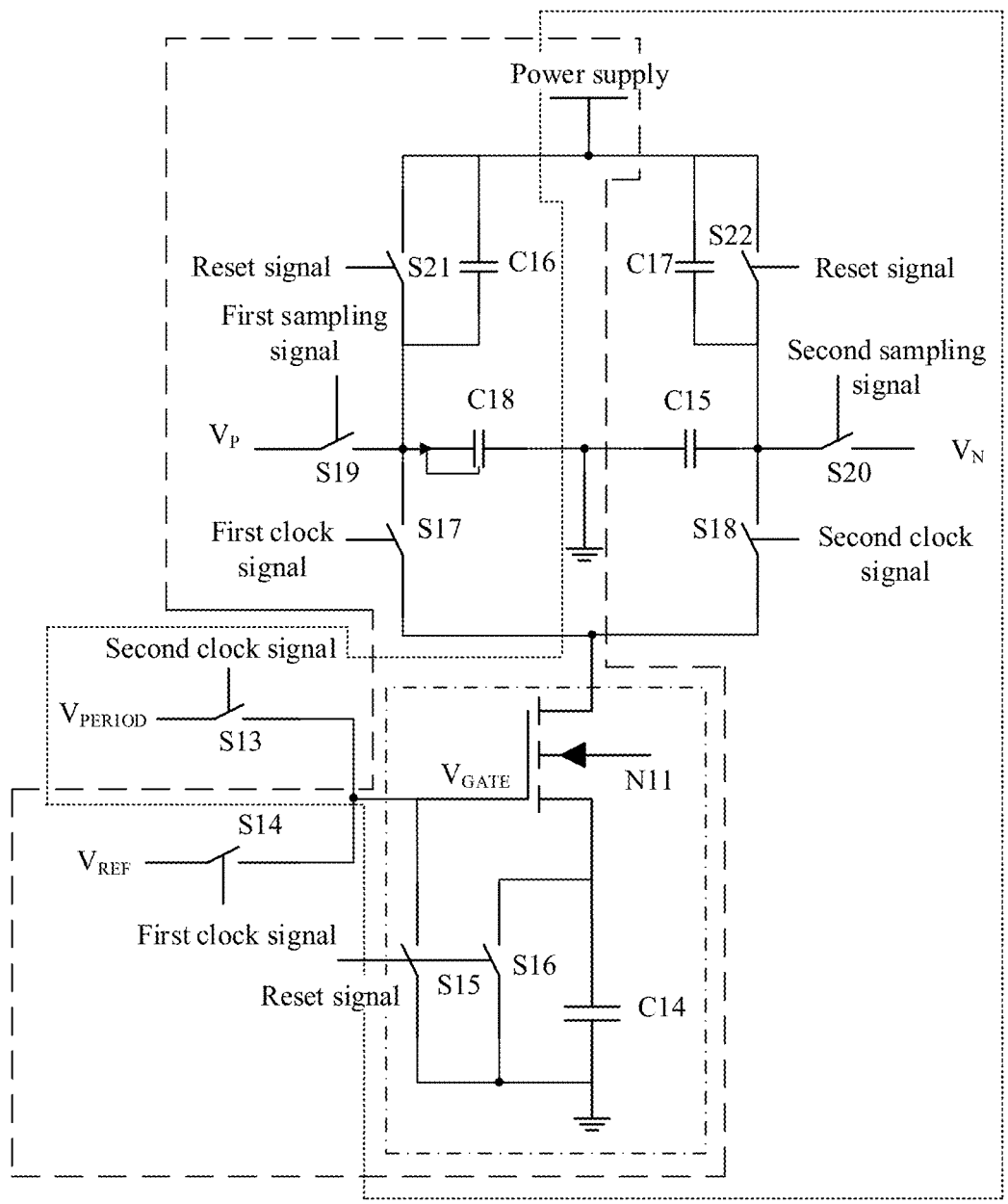
FIG. 6 is a circuit diagram of an example first amplifier according to an embodiment of this application.

FIG. 6 shows a circuit structure of an example first amplifier.

As shown in FIG. 6, the first amplifier 130 may include a first input terminal, a second input terminal, a first amplification circuit, a second amplification circuit, a first output terminal, and a second output terminal. The first amplification circuit and the second amplification circuit may share a voltage-current conversion circuit.

The first input terminal is connected to the first voltage generator 110, and is configured to input the first voltage $V_{REF}$ generated by the first voltage generator 110.

The second input terminal is connected to the second voltage generator 120, and is configured to input the second voltage $V_{PERIOD}$ generated by the second voltage generator 120.

The first output terminal is configured to output the third voltage $V_P$. The third voltage $V_P$ is a voltage output after the first voltage $V_{REF}$ passes through the first amplification circuit.

The second output terminal is configured to output the fourth voltage $V_N$. The fourth voltage $V_N$ is a voltage output after the second voltage $V_{PERIOD}$ passes through the second amplification circuit.

The following first describes structures of the voltage-current conversion circuit, the first amplification circuit, and the second amplification circuit in sequence, and then describes a working process of the first amplifier with reference to the structures of the voltage-current conversion circuit, the first amplification circuit, and the second amplification circuit, and the time sequence relationship between the signals shown in FIG. 2.

Refer to FIG. 6. The voltage-current conversion circuit may include a first switch S15, a second switch S16, a first capacitor C14, and a MOS transistor N11.

Both the first switch S15 and the second switch S16 are switches turned on by using a high level signal. Both the first switch S15 and the second switch S16 are controlled by the reset signal.

Both the first switch S15 and the second switch S16 are closed when the reset signal is at a high level, and both the first switch S15 and the second switch S16 are opened when the reset signal is at a low level.

The first capacitor C14 is connected in parallel to the second switch S16, a first terminal of the first capacitor C14 is connected to a source of the MOS transistor N11, and a second terminal of the first capacitor C14 is grounded. A gate of the MOS transistor N11 is grounded through the first switch S15.

The MOS transistor N11 may be an N-type MOS transistor.

Still referring to FIG. 6. The first amplification circuit may include a third switch S14, the voltage-current conversion circuit, a fourth switch S17, a fifth switch S19, a sixth switch S21, a second capacitor C18, and a third capacitor C16.

The third switch S14, the fourth switch S17, the fifth switch S19, and the sixth switch S21 are switches turned on by using a high level signal. Both the third switch S14 and the fourth switch S17 are controlled by the first clock signal, the fifth switch S19 is controlled by the first sampling signal, and the sixth switch S21 is controlled by the reset signal.

Both the third switch S14 and the fourth switch S17 are closed when the first clock signal is at a high level, and both the third switch S14 and the fourth switch S17 are opened when the first clock signal is at a low level. The fifth switch S19 is closed when the first sampling signal is at a high level, and the fifth switch S19 is opened when the first sampling signal is at a low level. The sixth switch S21 is closed when the reset signal is at a high level, and the sixth switch S21 is opened when the reset signal is at a low level.

The first input terminal is connected to the gate of the MOS transistor N11 through the third switch S14. A drain of the MOS transistor N11 is connected to a first terminal of the second capacitor C18 through the fourth switch S17, and a second terminal of the second capacitor C18 is grounded.

The third capacitor C16 is connected in parallel to the sixth switch S21, a first terminal of the third capacitor C16 is connected to the power supply, and a second terminal of the third capacitor C16 is connected to the first terminal of the second capacitor C18. When the fifth switch S19 is closed, a voltage at the first terminal of the second capacitor C18 is the third voltage $V_P$.

Still referring to FIG. 6. The second amplification circuit may include a seventh switch S13, the voltage-current conversion circuit, an eighth switch S18, a ninth switch S20, a tenth switch S22, a fourth capacitor C15, and a fifth capacitor C17.

The seventh switch S13, the eighth switch S18, the ninth switch S20, and the tenth switch S22 are switches turned on by using a high level signal. Both the seventh switch S13 and the eighth switch S18 are controlled by the second clock signal, the ninth switch S20 is controlled by the second sampling signal, and the tenth switch S22 is controlled by the reset signal.

Both the seventh switch S13 and the eighth switch S18 are closed when the second clock signal is at a high level, and both the seventh switch S13 and the eighth switch S18 are opened when the second clock signal is at a low level. The ninth switch S20 is closed when the second sampling signal is at a high level, and the ninth switch S20 is opened when the second sampling signal is at a low level. The tenth switch S22 is closed when the reset signal is at a high level, and the tenth switch S22 is opened when the reset signal is at a low level.

The second input terminal is connected to the gate of the MOS transistor N11 through the seventh switch S13. The drain of the MOS transistor N11 is connected to a first terminal of the fourth capacitor C15 through the eighth switch S18, and a second terminal of the fourth capacitor C15 is grounded.

The fifth capacitor C17 is connected in parallel to the tenth switch S22, a first terminal of the fifth capacitor C17 is connected to the power supply, and a second terminal of the fifth capacitor C17 is connected to the first terminal of the fourth capacitor C15. When the ninth switch S20 is closed, a voltage at the first terminal of the fourth capacitor C15 is the fourth voltage $V_N$.

A capacitance value of the second capacitor C18 is equal to a capacitance value of the fourth capacitor C15, and a capacitance value of the third capacitor C16 is equal to a capacitance value of the fifth capacitor C17.

The following describes the working process of the first amplifier with reference to the structures of the voltage-current conversion circuit, the first amplification circuit, and the second amplification circuit, and the time sequence relationship between the signals shown in FIG. 2.

Still referring to FIG. 6. When the first clock signal is at a high level, both the reset signal and the first sampling signal are at a low level. In this case, both the third switch S14 and the fourth switch S17 are closed, and the first switch S15, the second switch S16, the sixth switch S21, and the fifth switch S19 are opened. A voltage $V_{GATE}$ at the gate of the MOS transistor N11 is the first voltage $V_{REF}$. The MOS transistor N11 may convert the first voltage $V_{REF}$ into a current, and output the current from the drain. The MOS transistor N11 charges the first capacitor C14. In this case, the fourth switch S17 is closed, so that the current of the MOS transistor N11 discharges the second capacitor C18 and the third capacitor C16.

After the first clock signal changes from a high level to a low level, the third switch S14 and the fourth switch S17 are opened, charging the first capacitor C14 is stopped, and discharging the second capacitor C18 and the third capacitor C16 is stopped. The first sampling signal changes from a low level to a high level. In this case, the voltage at the first terminal of the second capacitor C18 is the third voltage $V_P$. After the first sampling signal changes back to a low level, the fifth switch S19 is opened, and the third voltage $V_P$ is maintained. In this case, the second clock signal has not changed to a high level, the reset signal changes to a high level, the first switch S15 is closed, and the voltage $V_{GATE}$ at the gate of the MOS transistor N11 changes to 0. The second switch S16 is closed to reset electric quantity on the first capacitor C14, and the sixth switch S21 is closed to reset electric quantity on the third capacitor C16.

When the second clock signal is at a high level, both the reset signal and the second sampling signal are at a low level. In this case, the seventh switch S13 and the eighth switch S18 are closed, and the first switch S15, the second switch S16, the tenth switch S22, and the ninth switch S20 are opened. The voltage $V_{GATE}$ at the gate of the MOS transistor N11 is the second voltage $V_{PERIOD}$. The MOS transistor N11 may convert the second voltage $V_{PERIOD}$ into a current, and output the current from the drain. The MOS transistor N11 charges the first capacitor C14. In this case, the eighth switch S18 is closed, so that the current of the MOS transistor N11 discharges the fourth capacitor C15 and the fifth capacitor C17.

After the second clock signal changes from a high level to a low level, S13 and S18 are opened, charging the first capacitor C14 is stopped, and discharging the fourth capacitor C15 and the fifth capacitor C17 is stopped. The second sampling signal changes from a low level to a high level. In this case, the voltage at the first terminal of the fourth capacitor C15 is the fourth voltage $V_N$. After the second sampling signal changes back to a low level, the ninth switch S20 is opened, and the fourth voltage $V_N$ is maintained. In this case, the first clock signal has not changed to a high level, the reset signal changes to a high level, the first switch S15 is closed, and the voltage $V_{GATE}$ at the gate of the MOS transistor N11 changes to 0. The second switch S16 is closed to reset the electric quantity on the first capacitor C14, and the tenth switch S22 is closed to reset electric quantity on the fifth capacitor C17.

If there is a difference between the first voltage $V_{REF}$ and the second voltage $V_{PERIOD}$, there is a difference in discharging the second capacitor C18 and the fourth capacitor C15 by the MOS transistor N11. Therefore, there is a difference between the third voltage $V_P$ and the fourth voltage $V_N$.

Specifically, a gain $A_1$ of the first amplifier 130 is defined as follows:

$$A_1 = \frac{V_P - V_N}{V_{PERIOD} - V_{REF}} \quad (2)$$

A specific expression of the gain $A_1$ of the first amplifier 130 is as follows:

$$A_1 = \frac{\partial \times Gm}{\text{Freq} \times \text{Cap}} \quad (3)$$

$\partial$ represents a ratio of duration in which the first clock signal is at a high level to a period of the first clock signal, or $\partial$ represents a ratio of duration in which the second clock signal is at a high level to a period of the second clock signal; Gm represents transconductance (a current change value generated based on a unit voltage change) of the MOS transistor N11; Freq represents a frequency of the first clock signal or the second clock signal; and Cap represents the capacitance value of the third capacitor C16 or the fifth capacitor C17.

When a low-frequency noise voltage exists in the MOS transistor N11, a noise current generated by the MOS transistor N11 generates a same voltage change for the third voltage $V_P$ and the fourth voltage $V_N$.

The second amplifier 140 is a differential amplifier, and is configured to amplify a difference between the third voltage $V_P$ and the fourth voltage $V_N$. The second amplifier 140 may include a third input terminal, a fourth input terminal, and a third output terminal. The third input terminal may be connected to the first output terminal of the first amplifier 130, and is configured to input the third voltage $V_P$. The fourth input terminal may be connected to the second output terminal of the first amplifier 130, and is configured to input the fourth voltage $V_N$. The third output terminal may be configured to output the fifth voltage $V_{OUT}$.

When the second amplifier 140 differentially amplifies the third voltage $V_P$ and the fourth voltage $V_N$, noise generated by the MOS transistor N11 may be canceled out in a $V_P$-$V_N$ operation.

Closed-loop noise N of the second amplifier 140, the low-pass filter 150, and the voltage-controlled oscillator 160 in a loop may be expressed as follows:

$$N = \frac{\text{Noise} \times \frac{T}{A_1 \times A_{RC}}}{1 + T} \quad (4)$$

Noise represents equivalent input noise of the second amplifier 140, the low-pass filter 150, and the voltage-controlled oscillator 160 input to the input terminal of the second amplifier, T represents a loop gain, $A_{RC}$ represents a gain of the second voltage generator, and $A_1$ represents the gain of the first amplifier 130.

It can be seen from the formula (4) that a higher gain of the first amplifier 130 indicates lower noise N of the second amplifier 140.

Therefore, the first amplifier 130 can not only avoid noise introduced by the first amplifier 130, but also reduce noise of the second amplifier 140, the low-pass filter 150, and the voltage-controlled oscillator 160. This reduces internal noise of the RC oscillator, and reduces a jitter of the clock signal.

Figure 7:
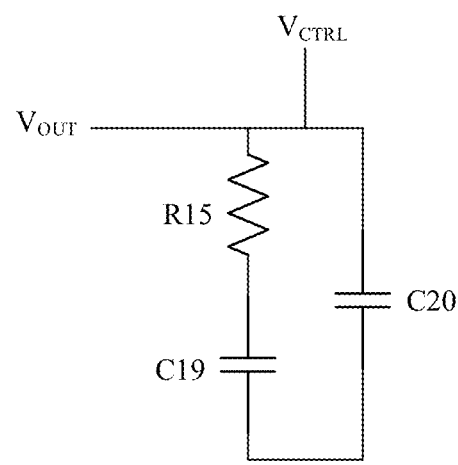
FIG. 7 is a circuit diagram of an example low-pass filter according to an embodiment of this application.

FIG. 7 shows a circuit structure of an example low-pass filter 150.

As shown in FIG. 7, the low-pass filter 150 may include a resistor R15, a capacitor C19, and a capacitor C20.

A first terminal of the resistor R15 is connected to the third output terminal of the second amplifier 140, and is configured to input the fifth voltage $V_{OUT}$. A second terminal of R15 may be connected to a first terminal of the capacitor C19, a second terminal of the capacitor C19 may be connected to a first terminal of the capacitor C20, and a second terminal of the capacitor C20 may be connected to the first terminal of R15. The second terminal of the capacitor C20 may be connected to the first terminal of the resistor R15. The second terminal of the capacitor C20 may be connected to the voltage-controlled oscillator 160, and a voltage at the second terminal of the capacitor C20 is the control voltage $V_{CTRL}$.

The capacitor C19 is a main filter capacitor and provides a dominant pole for the RC oscillator 10. Because there are two amplifiers in the RC oscillator 10, that is, the first amplifier 130 and the second amplifier 140, the RC oscillator 10 generates two poles. To ensure stability of the RC oscillator 10, a zero is generated by connecting the capacitor C19 and the resistor R15 in series, and the zero can be used to cancel out a dominant pole generated by the first amplifier 130. A high-frequency pole is generated by using the capacitor C20 and the resistor R15 (this pole is far outside system bandwidth and does not affect loop stability), and can be used to filter out a high-frequency ripple in the RC oscillator 10.

The switches in the foregoing embodiments of this application are switches turned on by using a high level signal. This is not limited thereto. The switch in the embodiments of this application may alternatively be a switch turned on by using a low level signal.

Possibly, the switch turned on by using a low level signal may be a PNP transistor. When a base of the PNP transistor is at a low level, the PNP transistor is turned on.

Possibly, the switch turned on by using a low level signal may alternatively be a PMOS transistor. When a gate of the PMOS transistor is at a low level, the PMOS transistor is turned on.

A level of each signal generated by the pulse generator 170 when the switches are switches turned on by using a low level signal is opposite to a level of the signal generated by the pulse generator 170 when the switches are switches turned on by using a high level signal. If a signal generated by the pulse generator 170 is at a high level when a switch is a switch turned on by using a high level signal, the signal is at a low level when the switch is a switch turned on by using a low level signal. If a signal generated by the pulse generator 170 is at a low level when the switch is a switch turned on by using a high level signal, the signal is at a high level when the switch is a switch turned on by using a low level signal. Details are not described herein.

The MOS transistor N11 in the foregoing embodiments of this application is an N-type MOS transistor. This is not limited thereto. The MOS transistor N11 in the embodiments of this application may alternatively be a P-type MOS transistor.

When the MOS transistor N11 is a P-type MOS transistor, except that the source of the MOS transistor N11 is connected to the power supply through the first capacitor C14, and the first terminal of the third capacitor C16 or the fifth capacitor C17 is grounded, other components in the first amplifier 130 and a connection relationship between the components are the same as those shown in FIG. 6. Details are not described herein again.

The foregoing descriptions are merely specific implementations of the embodiments, and are not intended to limit the protection scope of the embodiments. Variations or replacements within the technical scope disclosed in the embodiments shall fall within the protection scope of the embodiments. The protection scope of the embodiments shall be subject to the protection scope of the claims.

What is claimed is:

1. An integrated circuit comprising a first amplifier and a second amplifier, wherein,
    the first amplifier comprises a first input terminal, a second input terminal, a first amplification circuit, a second amplification circuit, a first output terminal, and a second output terminal, wherein:
    the first input terminal is configured to input a first voltage, and the second input terminal is configured to input a second voltage;
    the first output terminal is configured to output a third voltage, wherein the third voltage is a voltage obtained based on the first voltage input into the first amplification circuit; and
    the second output terminal is configured to output a fourth voltage, wherein the fourth voltage is a voltage obtained based on the second voltage input into the second amplification circuit, wherein:
    the first amplification circuit and the second amplification circuit share a voltage-current conversion circuit; and
    the second amplifier comprises a third input terminal, a fourth input terminal, and a third output terminal, wherein:
    the third input terminal is configured to input the third voltage;
    the fourth input terminal is configured to input the fourth voltage; and
    the third output terminal is configured to output a fifth voltage;

wherein the integrated circuit further comprises a low-pass filter and a voltage-controlled oscillator; and wherein a control voltage is obtained based on the fifth voltage input into the low-pass filter and a clock signal is obtained based on the control voltage input into the voltage-controlled oscillator.

2. The integrated circuit according to claim 1, wherein the integrated circuit further comprises a pulse generator, wherein the pulse generator is configured to generate, based on the clock signal, a control signal used to control the first amplifier.

3. The integrated circuit according to claim 2, wherein the control signal comprises a first clock signal, a second clock signal, and a reset signal; and the voltage-current conversion circuit comprises a first switch, a second switch, a first capacitor, and a MOS transistor, wherein:

both the first switch and the second switch are turned on by a high level signal, and both the first switch and the second switch are controlled by the reset signal;

the first capacitor is connected in parallel to the second switch, a first terminal of the first capacitor is connected to a source of the MOS transistor, and a second terminal of the first capacitor is grounded; and a gate of the MOS transistor is grounded through the first switch.

4. The integrated circuit according to claim 3, wherein the control signal further comprises a first sampling signal; and the first amplification circuit comprises a third switch, the voltage-current conversion circuit, a fourth switch, a fifth switch, a sixth switch, a second capacitor, and a third capacitor, wherein:

the third switch, the fourth switch, the fifth switch, and the sixth switch are turned on by a high level signal, both the third switch and the fourth switch are controlled by the first clock signal, the fifth switch is controlled by the first sampling signal, and the sixth switch is controlled by the reset signal;

the first input terminal is connected to the gate of the MOS transistor through the third switch;

a drain of the MOS transistor is connected to a first terminal of the second capacitor through the fourth switch, and a second terminal of the second capacitor is grounded;

the third capacitor is connected in parallel to the sixth switch, a first terminal of the third capacitor is connected to a power supply, and a second terminal of the third capacitor is connected to the first terminal of the second capacitor; and the fifth switch is connected to the first terminal of the second capacitor, and when the fifth switch is closed, a voltage at the first terminal of the second capacitor is the third voltage.

5. The integrated circuit according to claim 4, wherein the control signal further comprises a second sampling signal; and the second amplification circuit comprises a seventh switch, the voltage-current conversion circuit, an eighth switch, a ninth switch, a tenth switch, a fourth capacitor, and a fifth capacitor;

the seventh switch, the eighth switch, the ninth switch, and the tenth switch are turned on by a high level signal, both the seventh switch and the eighth switch are controlled by the second clock signal, the ninth switch is controlled by the second sampling signal, and the tenth switch is controlled by the reset signal;

the second input terminal is connected to the gate of the MOS transistor through the seventh switch;

the drain of the MOS transistor is connected to a first terminal of the fourth capacitor through the eighth switch, and a second terminal of the fourth capacitor is grounded;

the fifth capacitor is connected in parallel to the tenth switch, a first terminal of the fifth capacitor is connected to the power supply, and a second terminal of the fifth capacitor is connected to the first terminal of the fourth capacitor; and the ninth switch is connected to the first terminal of the fourth capacitor, and when the ninth switch is closed, a voltage at the first terminal of the fourth capacitor is the fourth voltage.

6. The integrated circuit according to claim 4, wherein the integrated circuit further comprises a second voltage generator;

the pulse generator is further configured to generate, based on the clock signal, a charging signal and a discharging signal that are used to control the second voltage generator; and the second voltage generator comprises a first resistor, a sixth capacitor, an eleventh switch, and a twelfth switch, wherein:

both the eleventh switch and the twelfth switch are turned on by a high level signal, the eleventh switch is controlled by the charging signal, and the twelfth switch is controlled by the discharging signal;

a first terminal of the first resistor is connected to the power supply through the eleventh switch, a second terminal of the first resistor is connected to a first terminal of the sixth capacitor, and the sixth capacitor is connected in parallel to the twelfth switch; and the second voltage is a voltage at the first terminal of the sixth capacitor.

7. The integrated circuit according to claim 6, wherein the second voltage generator further comprises a seventh capacitor and a thirteenth switch, wherein:

the thirteenth switch is turned on by a high level signal, and the thirteenth switch is controlled by the second clock signal; and a first terminal of the seventh capacitor is connected to a second terminal of the sixth capacitor, and a second terminal of the seventh capacitor is connected to the first terminal of the first resistor through the thirteenth switch.

8. The integrated circuit according to claim 6, wherein a high-level pulse width of the discharging signal is less than a low-level pulse width of the charging signal.

9. The integrated circuit according to claim 6, wherein a high-level pulse width of the first clock signal is equal to a high-level pulse width of the second clock signal; and both the high-level pulse width of the first clock signal and the high-level pulse width of the second clock signal are less than a high-level pulse width of the charging signal.

10. The integrated circuit according to claim 5, wherein both a high-level pulse width of the first sampling signal and a high-level pulse width of the second sampling signal are less than a high-level pulse width of the first clock signal.

* * * * *